(12) United States Patent
Fragner et al.

(10) Patent No.: US 8,057,972 B2
(45) Date of Patent: Nov. 15, 2011

(54) CONSTANT CURRENT MULTI-BEAM PATTERNING

(75) Inventors: Heinrich Fragner, Vienna (AT); Elmar Platzgummer, Vienna (AT); Adrian Bürli, Zurich (CH)

(73) Assignee: IMS Nanofabrication AG, Vienna (AT)

( * ) Notice: Subject to any disclaimer, the term of this patent is extended or adjusted under 35 U.S.C. 154(b) by 37 days.

(21) Appl. No.: 12/619,071

(22) Filed: Nov. 16, 2009

(65) Prior Publication Data

US 2010/0124722 A1   May 20, 2010

(30) Foreign Application Priority Data

Nov. 20, 2008 (EP) ..................... 08450187

(51) Int. Cl.
*G03F 9/00* (2006.01)
*G03C 5/00* (2006.01)

(52) U.S. Cl. .............. 430/30; 430/5; 430/296; 430/396; 430/397; 430/942

(58) Field of Classification Search ................ 430/5, 30, 430/296, 396, 397, 942
See application file for complete search history.

(56) References Cited

U.S. PATENT DOCUMENTS

| | | | |
|---|---|---|---|
| 5,369,282 A | 11/1994 | Arai et al. | |
| 6,137,113 A | 10/2000 | Muraki | |
| 6,768,123 B2 | 7/2004 | Giering | |
| 6,768,125 B2 | 7/2004 | Platzgummer et al. | |
| 7,276,714 B2 | 10/2007 | Platzgummer et al. | |
| 7,459,247 B2 * | 12/2008 | Bijnen et al. | 430/22 |
| 2005/0242303 A1 | 11/2005 | Platzgummer | |
| 2008/0237460 A1 | 10/2008 | Fragner et al. | |

OTHER PUBLICATIONS

Berry et al., "Programmable aperture plate for maskless high-throughput nanolithography", J. Vac. Sci. Technol., Nov./Dec. 1997, vol. B15, No. 6, pp. 2382-2386.
European Search Report for application 09450212.7; dated Sep. 28, 2010, 9 pgs.

* cited by examiner

*Primary Examiner* — Christopher Young
(74) *Attorney, Agent, or Firm* — Kauth, Pomeroy, Peck & Bailey LLP

(57) ABSTRACT

The invention relates to a method for forming a pattern on a substrate surface of a target by means of a beam of electrically charged particles in a number of exposure steps, where the beam is split into a patterned beam and there is a relative motion between the substrate and the pattern definition means. This results in an effective overall motion of the patterned particle beam over the substrate surface and exposition of image elements on the substrate surface in each exposure step, wherein the image elements on the target are exposed to the beamlets multiply, namely several times during a number of exposure steps according to a specific sequence. The sequence of exposure steps of the image elements is arranged in a non-linear manner according to a specific rule from one exposure step to the subsequent exposure step in order to reduce the current variations in the optical column of the multi-beam exposure apparatus during the exposure of the pattern.

9 Claims, 6 Drawing Sheets

US 8,057,972 B2

CONSTANT CURRENT MULTI-BEAM PATTERNING

RELATED APPLICATIONS

This application claims priority to European Application Number 08450187.3 filed Nov. 20, 2008, the disclosures of which are incorporated herein by reference.

FIELD OF THE INVENTION

The invention relates to a method for forming a pattern on a surface of a target by means of a beam of electrically charged particles in a number of exposure steps, each step including: producing said particle beam, directing said particle beam through a pattern definition means and producing a number of beamlets using an aperture array of the pattern definition means having a plurality of regularly arranged apertures of identical shape defining the shape and relative position of said beamlets, and using an electrically controllable blanking means of the pattern definition means to effectively switch off the passage of selected beamlets, the remaining beamlets forming, as a whole, a patterned particle beam, projecting said patterned particle beam by means of an optical column comprising controllable particle optical means onto said substrate surface to form an image of those apertures which are switched on, each aperture corresponding to an image element on the substrate surface during respective uniformly timed exposure steps, where there is a relative motion between the substrate and the pattern definition means according to the movement of the beamlets over a sequence of adjacent image elements on the substrate surface, resulting in an effective overall motion of the patterned particle beam over the substrate surface and exposing said image elements on the surface in each exposure step, wherein the image elements on the target are exposed to the beamlets multiply, namely several times during a number of exposure steps according to a specific sequence.

BACKGROUND OF THE INVENTION

Multi-beam lithography by means of electrically charged particles has been investigated since the 1980s. One important application of particle-beam lithography is in semiconductor technology. Therein, lithography apparatus are used to define structures on a target, e.g., a silicon wafer. (Throughout this disclosure, the terms target and substrate are used interchangeably.) In order to define a desired pattern on a substrate wafer, the wafer is covered with a layer of a radiation sensitive resist. Afterwards, a desired structure is imaged onto the resist by means of a lithography apparatus, and the resist is then patterned by partial removal according to the pattern defined by the previous exposure step and then used as a mask for further structuring processes such as etching. In another important application the structures on the target may be generated by direct patterning without a resist, for example ion milling or reactive ion beam etching or deposition.

In 1997, I. L. Berry et al., in J. Vac. Sci. Technol. B, 15(6), 1997, pp 2382-2386, presented a writing strategy based on a blanking aperture array and an ion projection system. Arai et al., U.S. Pat. No. 5,369,282, discuss an electron beam exposure system using a so called blanking aperture array (BAA) which plays the role of a pattern definition means. The BAA carries a number of rows of apertures, and the images of the apertures are scanned over the surface of the substrate in a controlled continuous motion whose direction is perpendicular to the aperture rows. The rows are aligned with respect to each other in an interlacing manner to that the apertures form staggered lines as seen along the scanning direction. Thus, the staggered lines sweep continuous lines on the substrate surface without leaving gaps between them as they move relative to the substrate, thus covering the total area to be exposed on the substrate.

Starting from Berry's concept, E. Platzgummer et al., in the U.S. Pat. No. 6,768,125, presented a multi-beam direct write concept dubbed PML2 (short for "Projection Maskless Lithography"), employing a pattern definition device comprising a number of plates stacked on top of the other, among them an aperture array means and a blanking means. These separate plates are mounted together at defined distances, for instance in a casing. The aperture array means has a plurality of apertures of identical shape defining the shape of beamlets permeating said apertures, wherein the apertures are arranged within a pattern definition field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings. The teaching of the U.S. Pat. No. 6,768,125 with regard to the architecture and operation of the pattern definition device is hereby included as part of this disclosure by reference.

The PML2 multi-beam direct write concept allows for a large enhancement of the writing speed compared to single beam writers. This arises from the reduction of the required current density, the diminished importance of space charge due to the large cross section, the enhanced pixel transfer rate due to the parallel writing strategy, and the high degree of redundancy possible using a plurality of beams.

The U.S. Pat. No. 7,276,714 of the applicant/assignee discloses a pattern definition means for particle beam processing, comprising at least an aperture plate and blanking means. The apertures in the aperture plate are arranged in "interlocking grids", i.e., the apertures are arranged in groups in squares or rectangles whose basic grids are meshed together. This means that the positions of the apertures taken with respect to a direction perpendicular to a scanning direction and/or parallel to it are offset to each other by not only multiple integers of the effective width of an aperture, as taken along said direction, but also by multiple integers of an integer fraction of said effective width. In this context, "scanning direction" denotes the direction along which the image of the apertures formed by the charged-particle beam on a target surface is moved over the target surface during an exposure process.

The "interlocking grids"-solution allows a finer resolution on the target surface even though the individual spots formed by each image of an individual aperture are not decreased in size. Particular values of the fractional offsets are integer multiples of $\frac{1}{2}^K$ times the effective width of an aperture, where K is a positive integer.

Furthermore, the U.S. Pat. No. 7,276,714 describes the generation of grey scales by subsequent exposures of one pixel on the target by multiple apertures located in line, and shows how a shift register approach can be effectively applied to create grey scale patterns, i.e., exposure levels interpolated between a minimal ('black') and maximal ('white') exposure dose.

The state of the art PML2 concept is a strategy where the substrate is moved continuously, and the projected image of a structured beam delivers 100 percent of the exposure dose for the "white" pixels by subsequent exposures of apertures located in line. To realize grey levels, the total amount of apertures in line is subdivided into columns, the number of columns corresponding to the number of desired grey levels. In a recent variant described in the published US patent-application US 2008237460 by the applicant/assignee, a so called "trotting mode" writing strategy is proposed in which for each pixel one or a few beams along the (mechanical) scanning direction are used to deliver the full exposure dose to the pixels. The advantage of this variant is the reduced complexity of the CMOS structure and improved data management.

In all writing strategies based on a bitmap type of pattern coding, accurate placement control of the individual beams with respect to an ideal grid (physical grid, typically 20 nm pitch) is essential in order to fulfill lithographic requirements. While basically a systematic distortion of the image would cause a non-isotropic change of the blur, in the mentioned "trotting mode" a systematic distortion would also give rise to significant distortion of the pattern eventually generated since only one beam (or a few, depending on the chosen strategy and redundancy) contributes to the total exposure dose of one pixel. Similarly, the dose per level, which is directly related to the aperture size and current density at the respective position on the aperture plate, becomes more important in the case of the trotting mode.

Another parameter that has essential impact on the performance of the optical system is the current through the optical column of a maskless particle-beam exposure apparatus. The current is directly proportional to the charge density of the beam, i.e., the actual pattern density being exposed by the apparatus. The coulomb interactions of the particles (which depend on the charge density) are therefore dependent on the current. Thus, the blur of the individual beamlets increases with larger currents through the optical system. This blur, which is influenced by the coulomb interactions, is an essential parameter for the spatial resolution of the apparatus.

Especially when the exposure is performed in a scanning mode, the current will change when large features move into the exposure field. Thus, the target will be exposed with a strongly fluctuating blur at the feature borders, leading to a poor overall performance of the apparatus.

The same consideration applies when the apparatus uses grey-levels for exposing an image, as is described in the U.S. Pat. No. 7,276,714. Here, the current is not only dependent on the pattern density but varies, in addition, during the exposure process because of the grey levels being exposed.

Depending on the patterns to be exposed, the current variations may become as high as 100 percent of the maximum possible current, e.g., when a completely "white" exposure (all apertures open) follows a completely "black" exposure (all apertures closed).

SUMMARY OF THE INVENTION

It is an object of the present invention to allow for a proper exposure of the images to be patterned on a target in order to overcome the above-mentioned deficiencies.

This aim is met by a method for forming a pattern on a surface of a substrate of the kind as stated in the beginning, wherein the sequence of exposure steps of the image elements is arranged on the time axis in a non-linear manner according to a specific rule in order to reduce the current variations in the optical column of the multi-beam exposure apparatus during the exposure of the pattern.

The invention uses techniques that keep the target current constant and thus allows to overcome the adaptation of the optical column to target beam current variations.

Since the surface of the substrate, or the type of resist it is covered with usually have a linear and time-invariant behavior, i.e., only the total radiation dose matters but not the distribution over time, a certain exposure time interval of a certain chosen beam radiation power, relating to a certain grey level of a pixel, can be distributed freely over the total available time. When compositing such a total available time interval out of discrete sub-intervals, relating to on/off switching of beamlets, those sub-intervals can be rearranged over the total available time in any permutation. To obtain a spatially and timely homogeneous current distribution the switched beamlets have to be arranged as equally-distributed as possible from one exposure step to the next—generally speaking, it is demanded that the ratio of open apertures (i.e., beamlets) to available apertures should always match the average of this ratio as close as possible.

The exposure of the image elements happens in a non-linear manner, which means that a particular image element is not exposed continuously but in a number of exposure intervals that are rather randomly distributed over the available time, allowing for a spatially and timely homogeneous current distribution in each exposure step.

Preferably, the above mentioned specific rule allows for a number of permutations, all delivering the same dose to the target.

In a further embodiment of the invention, the exposure patterns are modified by including additional exposures of selected image elements as dummy exposures in the sequence of exposure steps in order to reduce the overall current variations in the optical column during exposure, where dummy exposures are exposures of image elements on areas of the substrate that are not intended to be exposed and for which the modification does not change the effect of the exposure and where the total dose per image element remains below a certain threshold. These exposure modifications can be used to keep the current through the optical system of the multi-beam exposure apparatus constant as long as the pattern density of the original image remains in a certain range. They also make it possible to obtain a spatially more uniform dose-distribution on the substrate.

In a preferred way to apply the idea of the invention, the image elements on the target are exposed to C+1 different grey levels, i.e., exposure levels interpolated between a minimal ('black') and maximal ('white') exposure dose, the respective grey level being realized as a sequence of exposure steps in which the aperture of the respective image element is switched on or switched off, respectively, depending on the actual grey level, wherein the sequence of exposure steps is arranged non-linearly according to a specific rule.

In yet another embodiment of the invention, the specific rule for the switching sequence is given by a matrix G of N×(C+1) elements $g_{ij} \in \{0,1\}$, with $N \geq C$, 0 denoting a "switched off"-state and 1 denoting a "switched on"-state, with N being the number of exposure steps, and G following the rule $$\sum_{i=1}^{N} g_{ij} = j \quad \forall \, j \in \{0, 1, \ldots C\}. \tag{1}$$

This embodiment shows a specific remapping of the grey levels to nonlinear aperture on-and-off sequences, wherein the sequences are designed to allow an almost constant current through the optical column of the multi-beam exposure apparatus when a standard image (i.e., an image where all grey levels are equally present; see detailed description below) is exposed. In the matrix G the exposure sequence for a certain grey level $j \in \{0, 1, \ldots, C\}$ is represented as the column vector $\{g_{1j}, g_{2j}, g_{3j}, \ldots, g_{Nj}\}$. All elements within such a vector are assigned to consecutive periods of equal time ($\tau$), in which the blankers are either closed or open, depending on the value $g_{ij}$.

Equation (1) is, in principle, the only requirement for the exposure sequence ensuring that the desired exposure doses are delivered to the image elements, because the resist behavior is linear and time-invariant and thus simply sums up the dose during the exposure.

In another embodiment of the invention, the matrix G further obeys the rule $$\left| \sum_{j=1}^{C} g_{ij} - \frac{C(C+1)}{2N} \right| \leq O_1 \qquad (2)$$

for all $i=1, 2, \ldots, N$.

With this rule it is possible to differentiate between different "orders" of sequence-structuring. For $O_1=0$, an optimal sequence is needed, since in every exposure step the same number of apertures has to be switched on. A less effective sequence—as for instance the linear mapping, which is known from prior art—results in a larger $O_1$, like $O_1=(C+1)/2$.

All sequences that fulfill equation (1) in general and equation (2) for a certain $O_1$ are called "level 1 bit shuffled exposure sequences of the order $O_1$". The basic idea of this bit shuffling level 1 is to identify a sequence that minimizes the order $O_1$, and hence results in a more constant current through the optical column of the multi-beam exposure apparatus during exposure of the standard image.

In yet another embodiment of the invention, the specific rule can be expanded to every single image element of the image to be exposed by additionally defining a proprietary matrix $G^{xy}$ of $N \times (C+1)$ elements $g_{ij}^{xy}$ for every image element, the elements following the rule $$\left| N \cdot \sum_{(x,y)}^{S_{xy}} g_{ij}^{xy} - j \cdot \text{card}(S_{xy}) \right| \leq O_2 \qquad (3)$$

$\forall \ j \in \{0, 1, \ldots, C\}, i \in \{1, 2, \ldots, N\},$ $S_{xy} \subseteq \{(x, y) \mid 1 \leq x \leq X \text{ and } 1 \leq y \leq Y\}, \text{card}(S_{xy}) \geq n_{min}$ This embodiment acknowledges the fact that there is no need for the matrix G to be identical for all pixels of the image on the target, i.e., for all beamlets switched on and off during exposure. A set of matrices $G^{xy}$ which fulfills (3) for a certain $O_2$ is called "level 2 bit shuffled exposure sequence of the order $O_2$". If a set of matrices $G^{xy}$ fulfills (3) with $O_2=0$ and (1) and (2) for each individual matrix with $O_1=0$, we call this set "completely bit shuffled".

For the sake of clarity it is mentioned here that the terms "pixel" and "image element" are used interchangeably in this description.

The specific rule in its different embodiments as stated above may preferably be combined with an adjustment of the switching sequence in dependence of the pattern density D to be exposed in order to compensate for the target current variations caused by fluctuations of D, wherein the target current I(target) is determined using the equation $$I(\text{target}) = I(\text{source}) * \text{AOR}, \qquad (4)$$

with AOR being the "aperture opening ratio" according to the equation $$\text{AOR} = D \cdot C/N, \qquad (5)$$

C being the number of different grey levels and N being the number of exposure steps.

Equation (4) expresses the dependency of the target current I(target) on the source current I(source). The exposure time interval $\tau$ may be simultaneously adapted inversely proportional to the source current variation.

In equation (4) the calculation of the target current is shown, wherein AOR represents the percentage of the apertures of the pattern definition means being transparent for the particle beam. (5) shows how the AOR can be influenced by variation of the switching sequence parameter N.

In yet another embodiment of the invention a possibility to keep the target current constant is presented, namely by interrupting the non-patterned beam of electrically charged particles in various exposure steps. Variation of the current of the non-patterned beam along with an adaptation of exposure timing parameters allows for a constant current of the patterned beam. This can be done because the current within the optical column is only relevant if it is greater zero. When the total beam current is switched off for a certain time during exposure, the current during the "on"-time of the apparatus matches the current required by the optical system of the multi-beam exposure apparatus.

BRIEF DESCRIPTION OF THE DRAWINGS

In the following, the present invention is described in more detail with reference to the drawings, which show.

DETAILED DESCRIPTION OF THE INVENTION

The preferred embodiment of the invention discussed in the following is a development from the PML2-type particle-beam exposure apparatus with a pattern definition (PD) system as disclosed in the U.S. Pat. No. 6,768,125 (=GB2 389 454 A) of the assignee/applicant, and with a large-reduction projecting system. In the following, first the technical background of the apparatus is discussed—as far as relevant to the invention—then the invention is presented in detail.

It should be appreciated that the invention is not restricted to the following embodiments or the particular layout of the PD-system, which merely represent one of the possible applications of the invention; the invention is suitable for other types of processing systems that employ a particle-beam with projector stages as well.

Maskless Charged Particle-Beam Processing Apparatus

Figure 1:
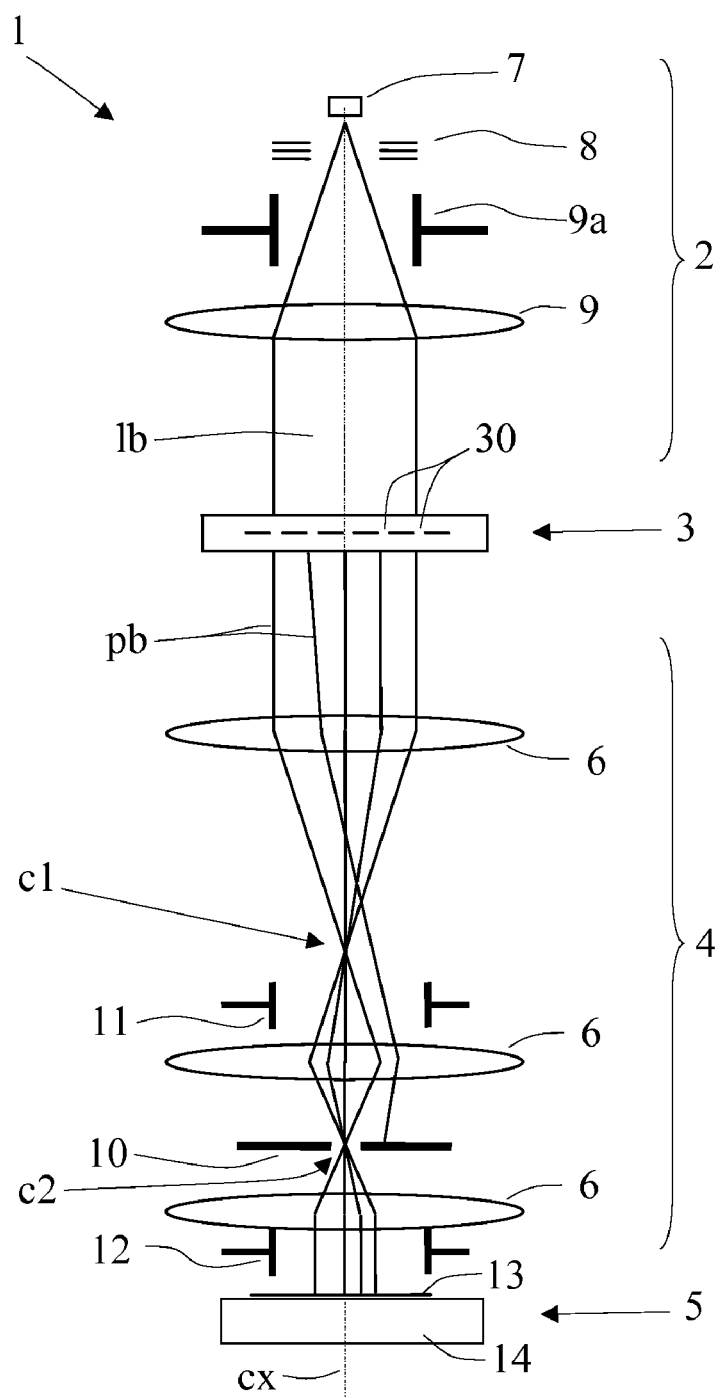
FIG. 1 a schematic overview of a particle-beam exposure apparatus according to prior art in a longitudinal section, but suitable for the invention, FIG. 2 a writing strategy according to prior art, where the beamlets are "trotting" over the target, FIG. 3 a schematic view of a pixel map of an exemplary image, FIG. 4 the current through the optical column of a particle-beam exposure apparatus when exposing the pixel map from FIG. 3 in a straight-forward manner, FIG. 5 a three-dimensional visualization of the switching of the beamlets when exposing the pixel map of FIG. 3 in a straight-forward method, FIG. 6 a three-dimensional visualization of the switching of the beamlets when exposing the pixel map of FIG. 3 using the bit-shuffling method according to the invention, FIG. 7 the current through the optical column when exposing the pixel map with the method depicted in FIG. 6, FIG. 8 a straight-forward mapping of the grey levels ("stop-watch approach"), FIG. 9 the current through the optical column when exposing an average pixel map ("standard image") with the mapping as in FIG. 8, FIG. 10 a non-linear mapping of the grey levels according to the invention, and FIG. 11 the current through the optical column when exposing an average pixel map ("standard image") with the mapping method as in FIG. 10.

FIG. 1 shows a schematic overview of a maskless particle-beam processing apparatus PML2 which itself is known from prior art but is suitable to embody the present invention. The components are not shown to size; in particular, the lateral width of the particle beam lb, pb is exaggerated. In the following, only those details are given as needed to disclose the invention. For more details, the reader is referred to the U.S. Pat. Nos. 6,768,125 and 7,276,714.

The main components of the lithography apparatus 1—corresponding to the direction of the lithography beam lb, pb which in this example runs vertically downward in FIG. 1—are an illumination system 2, a PD system 3, a projecting system 4 and a target station 5 with a substrate 13 which is held and positioned by a wafer stage 14. The whole apparatus is contained in a vacuum housing (not shown) held at a high vacuum to ensure an unimpeded propagation of the beam lb, pb along the optical axis cx of the apparatus. The optical systems 2, 4 are realized using electrostatic or electromagnetic lenses which are depicted symbolically by reference numbers 6.

The illumination system 2 comprises, for instance, an electron gun 7, an extraction system 8 as well as a condenser lens system 9. A general blanking deflector 9a may be present as well. It should, however, be noted that in place of electrons, in general, other electrically charged particles can be used as well. Apart from electrons these can be, for instance, hydrogen ions or heavier ions, charged atom clusters, or charged molecules. In the context of this disclosure "heavier ions" refer to ions of elements heavier than C, such as O, N, or the noble gases Ne, Ar, Kr, Xe.

By means of the condenser lens system 9, the particles emitted from the illumination system 2 are formed into a wide, substantially telecentric particle beam serving as lithography beam lb. The lithography beam lb then irradiates the PD system 3 which is held at a specific position in the path of the lithography beam lb. The PD system 3 comprises a number of plates with a plurality of openings and/or apertures 30, arranged in regular arrays, which define a beam pattern to be projected on the substrate 13.

Some of the apertures and/or openings are "switched on" or "open" so as to be transparent to the incident beam in the sense that they allow the portion of the beam (beamlet) that is transmitted through it to reach the target. The other apertures and/or openings are "switched off" or "closed", in the meaning that the corresponding beamlets cannot reach the target (even though they may leave the PD system and travel through some portion of the projecting system 4); effectively, these "switched off" apertures and/or openings are non-transparent (opaque) to the beam. As a consequence, the lithography beam lb is structured into a patterned beam pb, emerging from the PD system 3. The pattern of switched on apertures and/or openings—the only portions of the PD system 3 which are transparent to the lithography beam lb—is chosen according to the pattern to be exposed on the substrate 13. It should be noted that the "switching on/off" of the beamlets usually is realized by a blanking means of a suitable kind provided in one of the plates of the PD system 3: "Switched off"—beamlets are deflected off their path (by very small angles) so they cannot reach the target but are merely absorbed somewhere in the lithography apparatus, e.g., by an absorbing plate 10. In FIG. 1 only five beamlets of the patterned beam pb are shown as representatives for an actual large number of beamlets. One of the beamlets is switched off and is absorbed at the absorbing plate 10 while the other four beamlets are directed to the target 13 and there form images of the respective apertures 6.

In the embodiment shown in FIG. 1, the projection system 4 is composed of a number of consecutive particle-optical projector stages, consisting of electrostatic or electromagnetic lenses and other deflection means. These lenses and means are shown in symbolic form only, since their application is well known from prior art. The projection system 4 employs a demagnifying imaging through crossovers c1, c2. The demagnification factor for both stages is chosen such that an overall demagnification of several hundred results, e.g., 200× (FIG. 1 is not to scale). A demagnification of this order is particularly suitable with a lithography setup, in order to alleviate problems of miniaturization in the PD device.

In the whole projection system 4, provisions are made to extensively compensate the lenses and/or deflection means with respect to chromatic and geometric aberrations. As a means to shift the image laterally as a whole, i.e., along a direction perpendicular to the optical axis cx, deflection means 11 and 12 are provided in the projection system 4. The deflection means can be realized as, for instance, a multipole electrode system which is either positioned near the crossover, as shown in FIG. 1 with the first deflection means 11, or after the final lens of the respective projector, as in the case with the second stage deflection means 12 in FIG. 1. In this apparatus, a multipole electrode is used as deflection means both for shifting the image in relation to the stage motion and for correction of the imaging system in conjunction with the alignment system. These deflection means 11, 12 are not to be confused with the deflection array means of the PD system 3 which are used to switch selected beamlets of the patterned beam pb "on" or "off", since the former only deal with the particle beam as a whole.

Suitably, a scanning stripe exposure strategy, where the substrate 13 is moved under the incident beam pb, is utilized. It should be noted that, since different parts of the substrate 13 are to be patterned differently, the number of "switched on" apertures can change quickly when the substrate is moved under the patterned beam. At the same time, the current, i.e., the particles traversing the optical column of the lithography apparatus 1 after the absorbing plate 10, may change considerably.

In one typical implementation, the size of the image of an array of apertures in the PD system 3 on the substrate 13 is 80 μm square. The substrate 13 is moved with a velocity of 3 mm/s underneath the patterned beam; so, a completely new area with a—possibly—different pattern is reached roughly every 30 ms. Consequently, the patterns change in a matter of milliseconds, and the optics of the lithography apparatus 1 have to cope with the changing current, i.e., the changing number of particles crossing the optical column.

Grey Scales

According to the PML2 concept the substrate 13 is moved continuously, and the same image element ("pixel.") on the target is covered many times by the images of a sequence of apertures during the same scanning movement. Since the target (i.e., the resist on the target) typically shows a linear and time invariant exposure behavior, the exposure of a pixel can be characterized by a single value corresponding to the accumulated dose. The PD system allows for binary control of the beamlets, i.e., on/off. In order to expose different dose gradations, the exposure time of each pixel has to be varied. In a real system this variation must be quantized, a practical approach being to perform the exposure of one (and each) pixel during a number N of intervals of duration $\tau$, in each interval having a beamlet impinging on that pixel or not. The exposure of a pixel can then be expressed in an integer value relating to the number of such intervals during which a beamlet impinges on it. The beamlets can either stem from the same aperture during all intervals or from different apertures.

Thus, considering one image element at some location on the target, if all apertures are switched on when they cover the image element, this will result in the maximum exposure: a "white" shade corresponding to 100 percent. In addition to a "white" shade, it is possible to expose an image element at the target according to a grey scale, namely, with an exposure level which would interpolate between minimal ("black") and maximal ("white") exposure doses. As has been explained before, a grey scale is realized by switching on a corresponding number of apertures in the line, for example, 8 out of 30 apertures, when moving the substrate 13 under the incident beam. Thus, the signal controlling the value of an image element is represented by abovementioned integer value, the so called grey scale code—for example an integer number coded as a binary number of n bits. There may be different numbers of grey shades.

Figure 3:
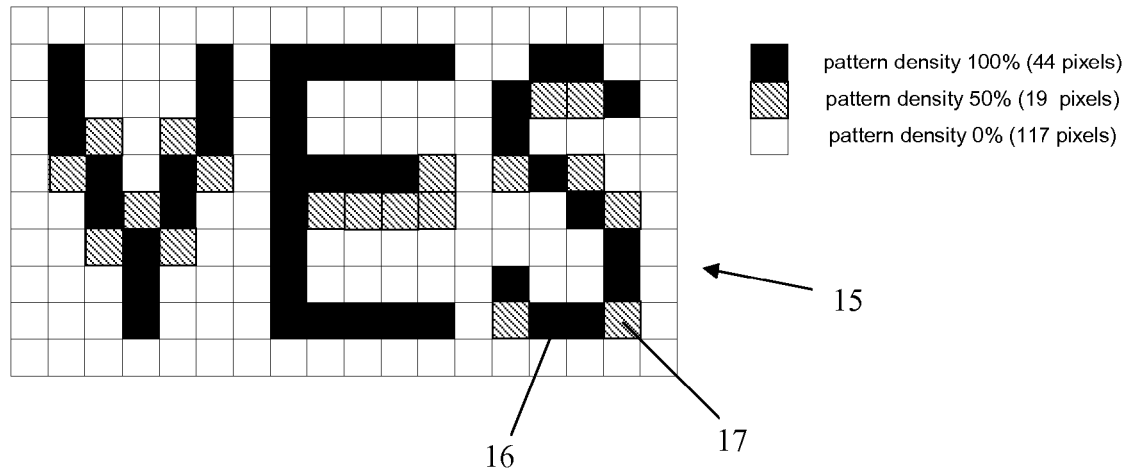

FIG. 3 shows a simple example of an image 15 with a size of 10×18=180 pixels, where some pixels 16 of the exposure area are exposed to a grey level of 100 percent and other pixels 17 are exposed to only 50 percent of the full grey level. The remaining pixels are exposed to a 0 percent dose (not exposed at all). Of course, in a realistic application of the invention, the number of pixels of the standard image would be much higher. However, here the number of pixels is only 180 for better clarity. Also, more grey levels could be used.

Trotting Mode

Figure 2:
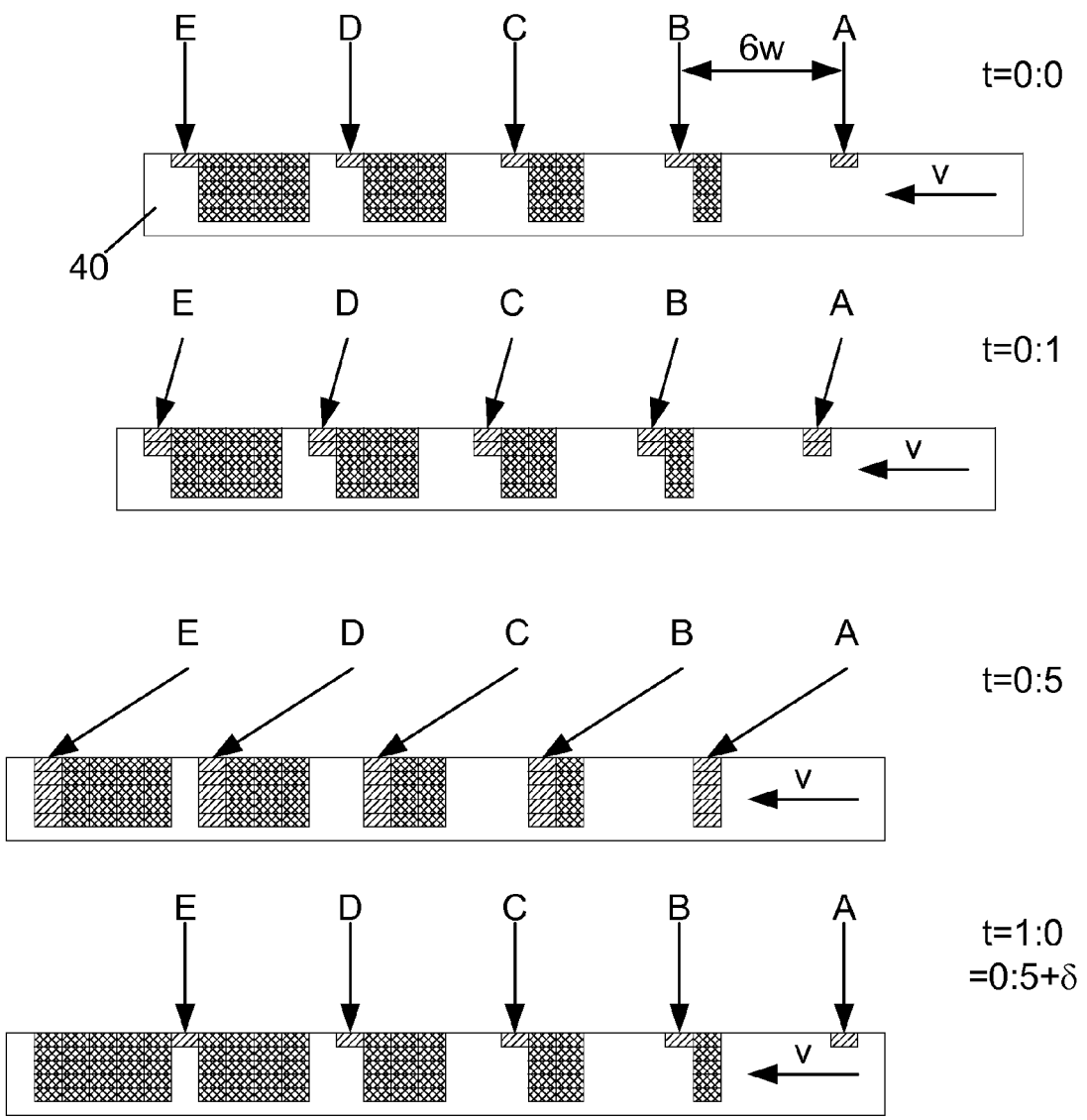

FIG. 2 illustrates the concept of the "trotting" strategy as discussed in the published US patent-application US 2008237460. A target 40, for instance a silicon wafer covered with a resist to be exposed, moves with a velocity v, while a number of beamlets (only five beamlets denoted A through E are shown for the sake of clarity) impinges on the target. Each beamlet passes the complete dose for one pixel to the resist during one pixel exposure cycle T1 lapsing between the uppermost and the lowermost frame in FIG. 2. Within the figure the cross-hatched fields denote pixels that are completely illuminated (according to the programmed pattern), while simply hatched fields indicate pixels which are currently exposed and thus are summing up the necessary dose. To simplify the explanation of the method, FIG. 2 does not account for grey scales; rather, in FIG. 2 only full exposures (100 percent grey scale, equivalent to a "white" shade) are shown.

The target is moved with respect to the PD device (which is assumed to remain at a fixed position beyond the top of FIG. 2), but the writing method requires that the location where each beamlet impinges on the target stays locked on the position of a pixel on the substrate during a respective pixel exposure cycle in spite of that relative movement, even for a movement of the target by a distance covering multiple pixels. As a consequence, the beamlets are deflected accordingly by means of the deflection system of the imaging optics.

The width of a pixel as exposed on the target is denoted w, the distance of two neighboring beamlets is H'w, wherein H' is one more than the number H of beamlets writing in parallel on one line. The factor H+1 is one simple choice to ensure that H and H' are coprime (relatively prime); any other number H' which is coprime to H could be used instead. Such a choice of H' and H will ensure the exposure of adjacent pixels through a run of H exposure cycles when performing equidistant translations of the projection between them. In the case of the simple example shown in FIG. 2, H=5 and H'=H+1=6. Starting from an initial position at the beginning of an exposure cycle, shown in the initial (uppermost) frame at t=0:0, the times are consecutively denoted as t=0:1 where the continuous motion of the target has progressed by one pixel width w, t=0:2 at two pixel widths 2w (not shown), and so on. At t=0:5 (t=0:H), the movement will have proceeded to a distance of five (H) pixel widths 5w, which marks the end of the actual exposure. After that, the beamlets are directed to another set of pixels as shown in the lowermost frame of FIG. 2 to start a next pixel exposure cycle at t=1:0 (which is a time point shortly after t=0:H; in other words t=0:H+=1:0, where denotes a small time interval used to switch the beamlets). Using this scheme, the exposure of H*k (k∈N) adjacent pixels requires k+(H−1) exposures.

It should be noted that the inclination of the beamlets in FIG. 2 is largely exaggerated; in a true depiction of a realistic geometry of a wafer process, the angles of inclination would be quite small and seemingly inconspicuous to the human eye. Moreover, it is also possible (by using, for instance, a consecutive set of electrostatic multipoles) to shift the set of beamlets laterally without affecting their orientation; in that case, the angle of inclination would not change at all. Also, the range of deflection may suitably be chosen to be symmetric around the z-axis.

In the above description, all pixels were assumed to be fully exposed to a 100 percent grey value. In a realistic case, of course, each pixel is attributed an individual grey value as dictated by the pattern to be exposed. Thus, when grey-scales are included, some beamlets are switched off in some of the exposure steps depicted, and the deposited doses would differ according to the grey scale from one pixel to the next. The on/off-switching of every blanker in the PD system is controlled according to the programmed pattern, during each pixel exposure cycle. For example, if one pixel which is illuminated by its corresponding beamlet is to receive a dose of 25 percent of the maximum value, the blanker for that beamlet has to be opened for 25 percent of the pixel exposure cycle covering that pixel.

The on/off-switching of every blanker in the PD device is controlled according to the programmed pattern, during each pixel exposure cycle. For example, if one pixel which is illuminated by its corresponding beamlet is to receive a dose of 25 percent of the maximum value, the blanker for that beamlet has to be opened for 25 percent of the pixel exposure cycle.

Generally, the optical system of the aforementioned apparatus has to be designed to match different parameters and to reach different requirements. One parameter that has essential impact on the performance of the optical system is the current through the optical column.

Since the particles of the beam are electrically charged, they will influence each other through coulomb interactions. The charge densities scale directly proportional with the beam current. The coulomb interactions, which depend on those charge densities, thus depend on the beam current, influencing the shape (and particularly the boundaries) of the patterns on the target. Thus, the blur of the individual beamlets, which is an essential parameter for the spatial resolution of the apparatus, increases with larger currents through the optical system.

Aperture-Opening Ratio

While it is relatively easy to maintain a constant current being emitted by the particle source, it is much more difficult to control—or even measure—the beam current after the PD system. The measurement of the current is inherently difficult because of the low total current and due to the fact that the measurement is not allowed to have any retroactive effect on the beam to be measured. Therefore, indirect methods for measuring the beam current have to be used.

By defining the aperture-opening ratio (AOR), which can have a value from 0 (all apertures closed) to 100 percent (all apertures open), the target current can be calculated with equation (4), $$I(\text{target}) = I(\text{source}) \cdot AOR.$$

If the AOR is known it is straightforward to calculate the current at the target. The AOR is closely connected to the pattern density D, which is defined as the sum of all grey-level values of all pixels of an exposure scaled to the range [0,1], i.e., it becomes 0 if no pixel is to be exposed and 1 if all pixels have the maximum grey-level value C. For a fixed I(source) a minimum time $T_{min}$ is necessary to deliver the dose $d_{max}$ for a fully exposed ("white", grey-level C) pixel:

$$d_{max} = I(\text{source}) \cdot T_{min}$$

An aperture delivering the full exposure dose to a pixel ("white") thus has to be open for $T_{min}$. When the open-periods of a large number of apertures are evenly distributed in an interval of available time $T_{exp}$ ($\geq T_{min}$), the mean AOR of this exposure becomes $$AOR = D \cdot T_{min}/T_{exp}$$

Especially when the exposure is performed in a scanning mode, the pattern density D will change when particularly heavily or sparsely patterned areas move in the exposure field. For fixed parameters I(source) and $T_{exp}$ this will lead to strong target current fluctuations, and hence the target will be exposed to a strongly fluctuating blur due to the changing strength of Coulomb interaction effects which will be particularly notable at the feature borders, leading to a poor overall performance of the apparatus.

As has been explained above, FIG. 3 shows an exemplary image 15 with a size of M=10×18=180 pixels, where some pixels 16 of the exposure area are exposed to a grey level of 100 percent and other pixels 17 are exposed to only 50 percent of the full grey level. The remaining pixels are exposed to a 0 percent dose, i.e., not exposed at all. Of course, in a realistic application of the invention, both the number of pixels and the number of different grey levels used in the image would be much higher. However, here the number of pixels is only 180 for the sake of clarity.

There are C+1 different levels of grey scales. The exposure is partitioned in N exposure steps of duration $\tau = T_{exp}/N$. Each pixel is exposed during a number $n \in \{0, 1, \ldots, C\}$ out of N exposure steps, with $N \geq C$; n=0 relates to a non-exposed pixel, and n=C relates to a fully exposed "white" pixel.

Figure 5:
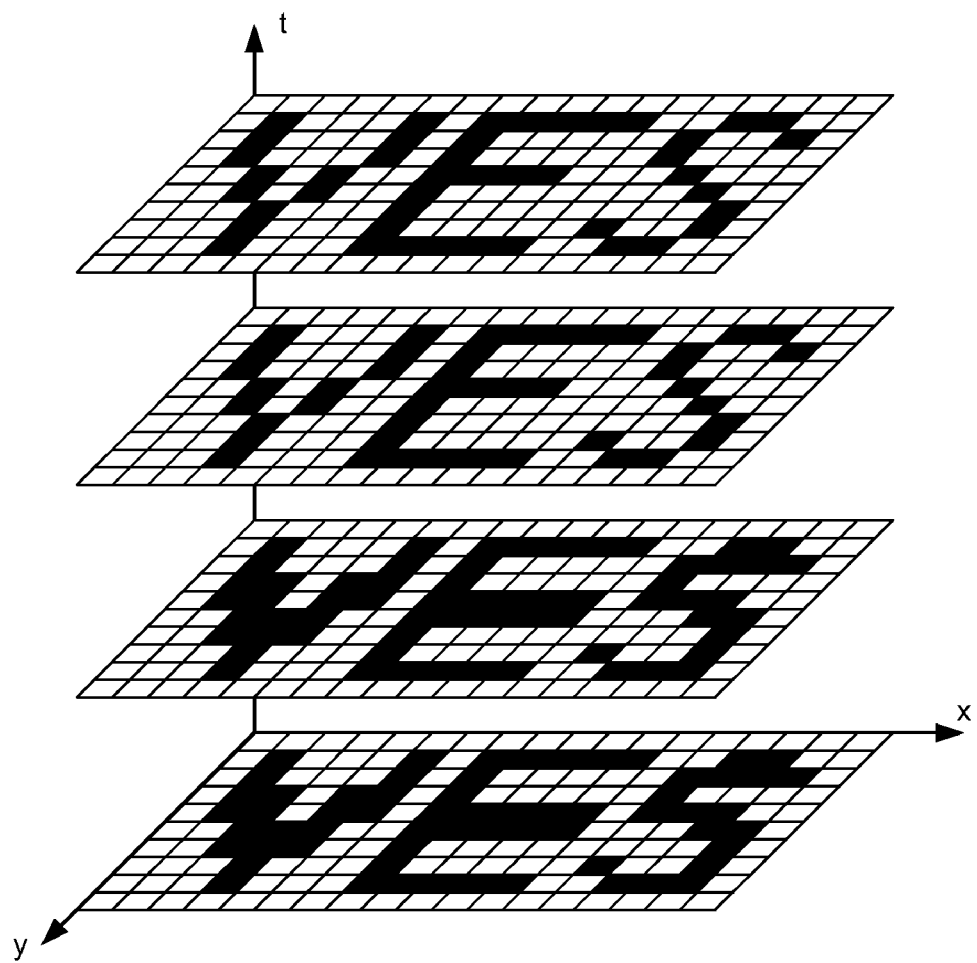

The straightforward approach to expose the image is to use a "stop-watch" scheme: for all grey levels the beamlet is switched on at time zero, and switched off after the desired exposure time has passed. This is depicted in FIG. 5, which shows the exposure of the image of FIG. 3 over time. First, all pixels with a grey level greater than 0 are exposed while at the end only the pixels with the highest grey level are exposed.

Figure 4:
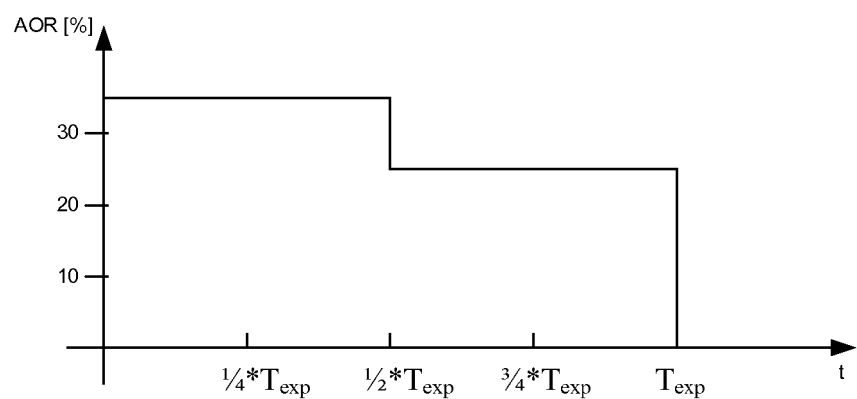

As a consequence, the current transmitted through the PD system onto the target varies extensively during the exposure process. This is illustrated in FIG. 4: Over the whole period of one exposure $T_{exp}$, the AOR varies between 20 percent and 40 percent of the maximum possible current, i.e., if all apertures would be open. This is due to the fact that at the beginning more beamlets are switched on as the 50 percent and the 100 percent grey level pixels are exposed. At the end, only the 100 percent grey level dots are switched on, thus, the current drops significantly.

If the AOR is known at any time, the beam optics (4 in FIG. 1) in the optical column could be adapted to the actual current through the column, as has been explained before. However, the necessary time constants for this adaptive optics would become considerably small for high throughput took. The exposure time $T_{exp}$ is typically in the range of some microseconds and thus the periods of constant current are shorter by one to two orders of magnitude for a typical. $N = 10^1 \ldots 10^2$. Since the adaptation of the optical column to different currents requires the setting of high voltages, the adaptation at such high rates would be considerably difficult to achieve.

Bit Shuffling Level 1

To overcome the current variation, a so called "bit shuffling level 1" according to the invention is introduced.

In order to assess the reduction of current variations it is advisable to define a standard image which consists of M pixels. All C+1 grey levels are equally distributed, i.e., M is a multiple of (C+1) and there are M/(C+1) pixels of every possible grey level available within the image. "Bit-shuffling level 1" is a remapping of the grey levels to nonlinear aperture on and off sequences, suitably designed to allow an almost constant current through the optical column when a standard image is exposed. The grey level mapping can be defined as an N×(C+1) matrix G with $N \geq C$ and with the elements $g_{ij} \in \{0,1\}$, where 0 denotes a closed aperture and 1 an open aperture. The exposure sequence for a certain grey level $j \in \{0, 1, 2, \ldots, C\}$ is then represented as the column vector $\{g_{1j}, g_{2j}, g_{3j}\}$. All elements within such a vector are assigned to consecutive periods of equal time ($\tau$), in which the apertures are either closed or open depending on the value $g_{ij}$.

The goal of the remapping is to obtain a correct mapping of the grey values—this means that the grey values are mapped throughout the N exposure steps with the lowest possible current variations between the steps.

In order to obtain a correct mapping of the set of grey values into exposure sequences, the elements of the matrix G have to obey equation (1), i.e., $$\sum_{i=1}^{N} g_{ij} = j \quad \forall j \in \{0, 1, \ldots C\}.$$

After the last of the N exposure steps, the dose of the resist should equal the requested dose j. This is the only requirement for the exposure sequence, because the resist behavior is linear and time-invariant and thus simply sums up the dose during the exposure. For obvious reasons, $g_{i0} = 0$ for all i. Thus, the first column of the matrix is fixed. A further constraint is put to the matrix G with equation (2) to obtain a more evenly distributed current during the exposure of the standard image:

$$\left| \sum_{j=1}^{C} g_{ij} - \frac{C(C+1)}{2N} \right| \leq O_1 \text{ for all } i = 1, 2, \ldots, N.$$

Equation (2) states that the sum of each row of the G matrix must not differ from the subtrahend by more than $O_1$, where the subtrahend is the number of all ones in the G matrix (sum of eq. (1) over all j, $1 \leq j \leq C$) divided by N, or, in other words, the mean number of ones per matrix row. All sequence sets (i.e., matrices G) that fulfill (1) and for which $O_1$ is the lowest value to fulfill (2) will hereinafter be called "level 1 bit shuffled exposure sequences of the order $O_1$". Obviously, $O_1=0$ will hold for an optimal sequence to fulfill (2), while for $O_1=(C+1)/2$ even a worst case sequence (e.g., the linear mapping) will do. When $O_1$ is close to zero the ratio of open apertures to available apertures is, by and large, kept constant throughout the exposures.

The basic idea of the "bit shuffling level 1" is to identify a sequence that minimizes the order $O_1$ and hence results in a more uniform current through the column during exposure of the standard image. Ideally, a matrix G of the order $O_1=0$ can be identified for this purpose.

Figure 6:
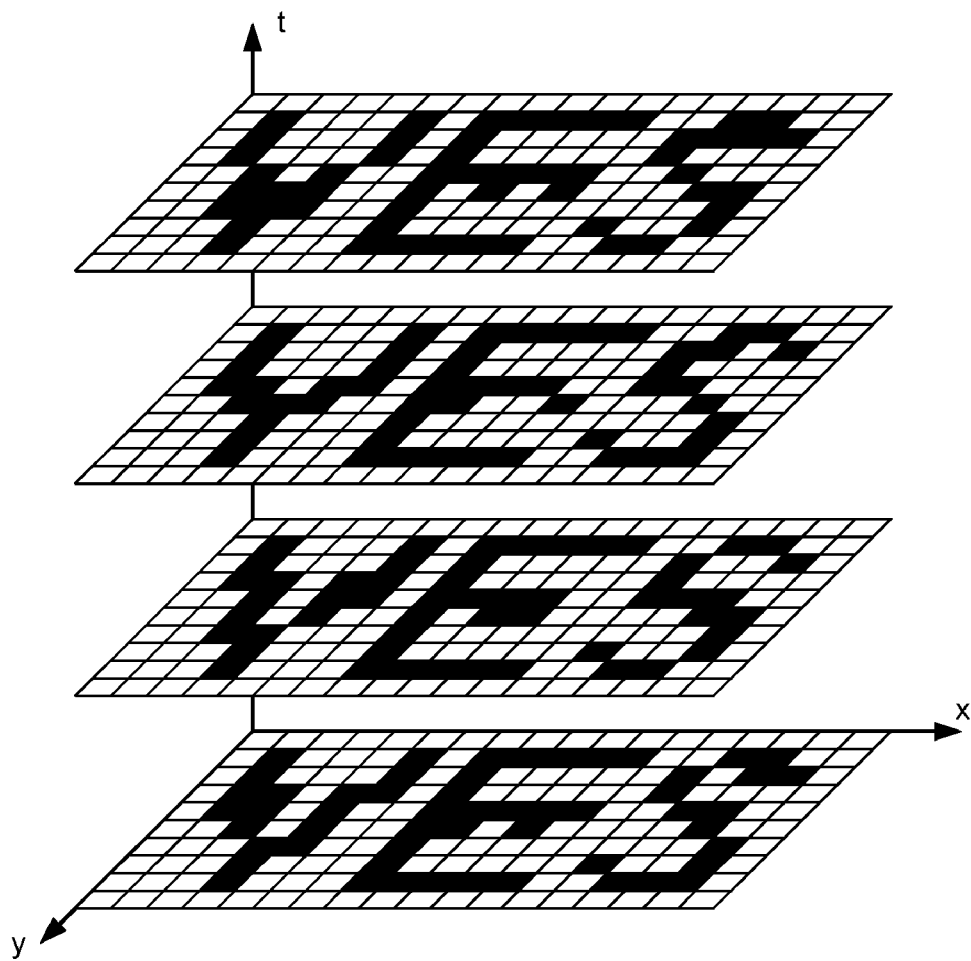

FIG. 6 shows the exposure of the image of FIG. 3 over time, applying a "bit shuffling level 1". This means that the different grey levels are exposed more or less randomly distributed. Since the resist on the substrate has a linear and time-invariant behavior the exposure of particular pixels with the same x- and y-coordinates can be reordered along the time axis in any permutation. To obtain a spatially and timely homogeneous current distribution, the pixels are arranged as equally distributed as possible within the three-dimensional array (x, y, t) in FIG. 6. In other words: In any subspace of the three-dimensional data array the ratio of open apertures to available apertures should match the average pattern density as closely as possible.

Figure 7:
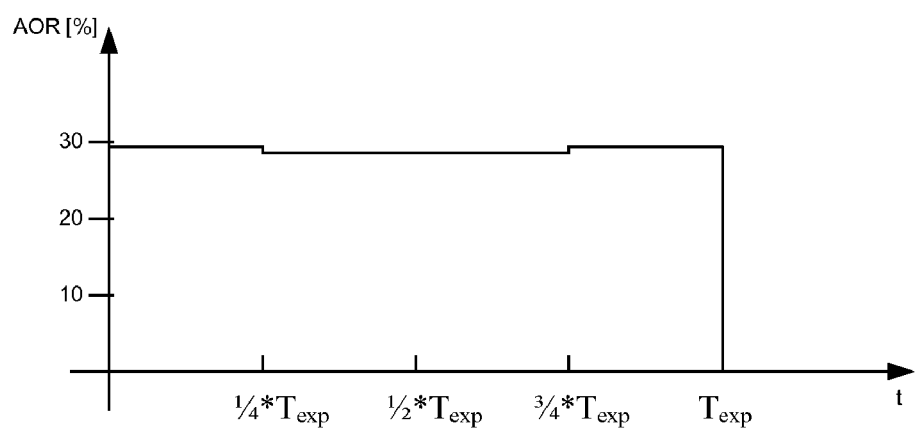

The resulting advantage is illustrated in FIG. 7, which shows the current variation over time. The current variation drops to 0.6 percent of the maximum possible current, i.e., if all apertures would be open, compared to the variations with the mapping sequence depicted in FIGS. 4 and 5.

Figure 8:
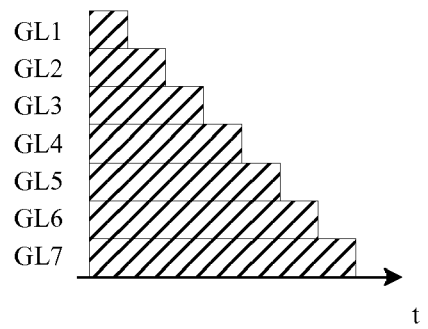
Figure 9:
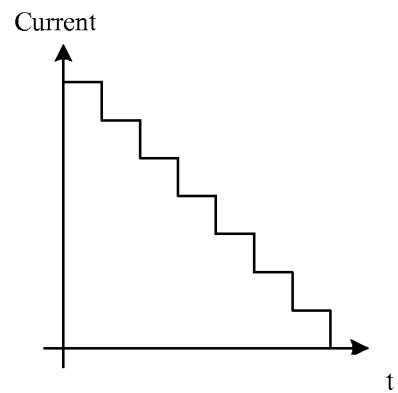

FIGS. 8-11 illustrate the concept according to the invention for the example of 8 grey levels (including 0): FIG. 8 shows the straight-forward approach from prior art, where in each step different numbers of grey levels (marked "GL" in FIG. 8) are exposed—beginning from all seven non-zero levels and ending with only one level being exposed. This leads to heavy current variations when exposing the standard image, as can be seen in FIG. 9.

Figure 10:
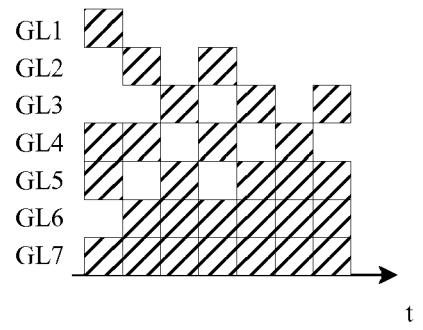

FIG. 10 shows an exemplary exposure sequence, where in each step the same number of pixels is exposed. This can be illustrated with the matrix G:

$$G = \begin{pmatrix} 0 & 1 & 0 & 0 & 1 & 1 & 0 & 1 \\ 0 & 0 & 1 & 0 & 1 & 0 & 1 & 1 \\ 0 & 0 & 0 & 1 & 0 & 1 & 1 & 1 \\ 0 & 0 & 1 & 0 & 1 & 0 & 1 & 1 \\ 0 & 0 & 0 & 1 & 0 & 1 & 1 & 1 \\ 0 & 0 & 0 & 0 & 1 & 1 & 1 & 1 \\ 0 & 0 & 0 & 1 & 0 & 1 & 1 & 1 \end{pmatrix}.$$

Figure 11:
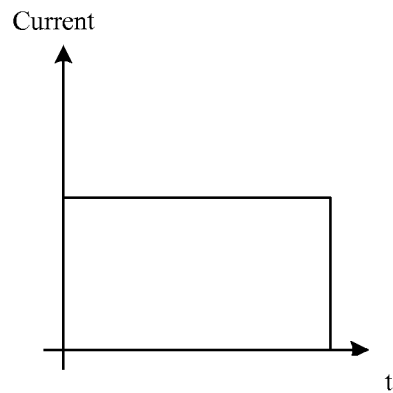

With the different grey scales being equally distributed, this leads to a current during exposure, which is, by and large, constant, as can be seen in FIG. 11.

The level 1 bit shuffling works well on images with different grey levels (GL), but might fail when only a small number of grey levels are used within the image. Thus, as a further aspect of the invention, a second step is introduced, which is referred to as "bit shuffling level 2".

Bit Shuffling Level 2

The matrix G does not need to be equal or uniform for all pixels of the image. Rather, a different matrix G can be assigned to every pixel within the image. Of course, each of the assigned matrices has to fulfill equation (1).

For a pixel on the position x, y within an image, the notation $G^{xy}$ is used to show that a certain matrix G is the mapping for said pixel. The elements of $G^{xy}$ are denoted as $g_{ij}^{xy}$. The "bit shuffling level 2" is defined in equation (3) as follows:

$$\left| N \cdot \sum_{(x,y)}^{S_{xy}} g_{ij}^{xy} - j \cdot \mathrm{card}(S_{xy}) \right| \leq O_2$$

$$\forall\, j \in \{0, 1, \ldots, C\}, i \in \{1, 2, \ldots, N\},$$

$$S_{xy} \subseteq \{(x, y) \mid 1 \leq x \leq X \text{ and } 1 \leq y \leq Y\},\ \mathrm{card}(S_{xy}) \geq n_{min}$$

The function card(•) shall evaluate to the cardinality of the set given as parameter, the cardinality being a measure of the number of elements of the set. Equation (3) formulates the objective that the fluctuation of the contribution of each grey level j to the total current has the upper boundary $O_2$ for every subset $S_{xy}$ of the pixels in the image area X×Y of at least $n_{min}$ elements (pixels) and for every discrete subinterval i of the exposure. For the subset $S_{xy}$ to have a physical meaning, their elements should be lumped, e.g., a set of pairs (x,y) within a maximum distance from a point.

All sets of matrices $G^{xy}$ of (3), of which each individual matrix also fulfills (1), are called "level 2 bit shuffled exposure sequences of the order $O_2$". The retrieval of an optimal sequence that fulfills equation (3) with $O_2=0$ also depends on the product XY (i.e., the size of the image).

A set of matrices $G^{xy}$ is called "completely bit shuffled", if it fulfills equation (3) with $O_2=0$ and equations (1) and (2) for each individual matrix with $O_1=0$.

For a specific implementation different algorithms can be chosen to find appropriate sets of matrices $G^{xy}$. There will in general always be a compromise between effort (computational power) and performance. It is important to distinguish between the definition (generation) of a matrix set $G^{xy}$ and the mapping during operation. The sequence will generally be defined offline, for example using an exhaustive search over feasible sets of $G^{xy}$, or using stochastic simulation ("Monte Carlo method").

The mapping will be performed online, i.e., during operation of the charged particle beam exposure apparatus respectively during runtime of the data preparation software, when the grey levels of an image are assigned to a specific aperture on/off sequence; this will normally be performed by using lookup tables and/or finite state machines. The term "state machine" here denotes highly optimized micro-processors that perform a specific sequence of commands that is defined within hardware.

Preferred Solution to the Bit-Shuffling Optimization Problem

In the following, an exemplary method of the mapping of matrices $G^{xy}$ is shown, which can be efficiently implemented. This section sets N=C; the extension to N≧C and its benefits are shown in the next section.

During the data preparation process the polygonal exposure data is transformed (rasterized) to grey level patterns. At an arbitrary point between the definition of the grey level for a pixel and the exposure of that pixel, the mapping step must take place. The mapping can take place on a conventional computer by an appropriate software routine, or it can be implemented directly in hardware as part of the physical data path or the PD itself. For implementation in hardware commonly used hardware design elements such as "look up tables" or "finite state machines" can be used.

If the grey level j is available as a binary number with the bits $j_n, j_{n-1}, \ldots, j_0$, the exposure sequence for any grey level $j \in \{0, 1, \ldots, C\}$ is defined as the column vector $\{j_n, j_n, \ldots j_n, j_{n-1}, j_{n-1}, j_2, j_2, j_2, j_2, j_1, j_1, j_0\}$. Within this vector of length $2^{n+1}-1$ every element $j_n$ occurs $2^n$ times, thus, such a line vector is called "bit weighted exposure vector". It is obvious that this vector fulfills equation (1) for every grey level j, and any permutation of this line vector simultaneously for all grey levels also yields valid mapping sequences, i.e., they fulfill equation (1). Additionally, they are level 1 bit shuffling sequences of order 0. These vectors are called "permutated bit weighted exposure vector".

Some of these permutation sequences can be easily mapped by use of a state machine, for instance within hardware. The next step is the level 2 bit shuffling sequence. Since a large number of possible mapping sequences has already been identified in the last paragraph, different permutations have to be assigned to different beamlets.

One simple way to obtain a level 2 bit shuffled set of matrices $G^{xy}$ is to "rotate" the matrices, i.e., all rows are shifted one position up and the topmost row is positioned at the bottom. Such sequences are called "rotated mapping sequences". This method yields N different matrices $G^{(0)}$) to $G^{(N-1)}$. Every matrix $G^{xy}$ has to be assigned to one of these N matrices; the N different matrices $G^0$ to $G^{(N-1)}$ have to be equally distributed, i.e., they have to have the same number of occurrences in the set of $G^{xy}$ matrices.

To allow an equal distribution of the N different matrices $G^{(0)}$ to $G^{(N-1)}$ it is necessary that N|XY, i.e., N divides X·Y without remainder.

Even if this cannot be fulfilled exactly, the distribution introduced by the level 2 shifted set of matrices $G^{xy}$ will be very equalized. The reason for this is that N is normally much smaller than XY, thus, the N different matrices $G^{(0)}$ to $G^{(N-1)}$ will be distributed almost equally.

With the above described method it is possible to maintain an almost constant current during one exposure (the N substeps), or eventually longer if the pattern density does not vary much between some consecutive exposures. However, the latter can usually not be presumed, hence additional adaptations have to be made.

Variation of Exposure Distribution Over Time

Using the parameters from the bit-shuffling approach, the above mentioned relation between AOR and pattern density D becomes $$AOR = D \cdot C/N.$$

Thus, by varying N the AOR can be changed and, within limits, held approximately constant for a pattern density D dictated by the exposure image. For the preferred bit-shuffling solution as presented above, N was fixed to N:=C; Now, N is varied (N>=C) by extending the generating column vector with (N-C) zeros $\{0, \ldots 0, j_n, j_n, \ldots, j_n, j_{n-1}, j_{n-1}, \ldots, j_2, j_2, j_2, j_2, j_1, j_1, j_0\}$. While eq. (1) is still fulfilled, eq. (2) cannot generally be met with $O_1=0$, i.e., only if N|C. However, when again applying level 2 bit-shuffling, since typically XY>>N, (3) can be fulfilled in a good approximation by including the zeros in the rotation of the column vectors. The zeros thus get distributed almost evenly over the N positions.

To apply this method, for every exposure with a certain pattern density D, a matrix set $G^{xy}$ is used that has an N that minimizes the difference between the so achieved AOR and the mean AOR over all exposures. The above-mentioned insertion of zeros can easily be implemented in hardware using finite state machines with counters for the rotation.

Subliminal Exposure Pattern Modification

Yet another method to keep the AOR constant is to vary the pattern density D by subliminally modifying the exposure image in areas where this has no effect on the outcome of the exposure. This is usually possible with resist exposure, since most resists have a high "contrast", i.e., the dose threshold that must be reached to trigger the chemical modification of the resist is sharply defined. Hence, both slightly reducing the delivered dose in stretches of full exposure and slightly increasing the delivered dose in unexposed ("dark") areas will not noticeably influence the exposure outcome, i.e., the contour lines after development, or the thickness of the remaining resist layer.

Source Current Variation with Exposure Timing Adaptation

As detailed before, the target current can be calculated as $I_{target}=I_{source} \cdot AOR$, with $AOR=D \cdot C/N$. Aside from varying the AOR in order to keep the target current stable for fluctuating pattern densities, it is also possible to exert influence on the target current by varying $I_{source}$. As mentioned above, the beam optics for the non-patterned beam 1b is easier to adapt than the one for the patterned beam. If the source current is varied, the exposure timing has to be adapted in order to have the same dose $d_{max} \sim I(source)/(\tau \cdot C)$ delivered, since a different current passes through the open apertures.

For example, if a mean target current $\overline{I_{target}}$ is to be maintained, and an exposure is to be performed with pattern density Di and desired maximum dose $d_{max}$ ("white"), the source current I(source1) and the exposure time parameters $\tau_1$ and $\tau_{exp1}$ are calculated as follows:

$$AOR_1 = D \cdot \frac{C}{N}$$

$$I_{source1} = \overline{I_{target}} / AOR_1$$

$$\tau_1 = d_{max} / (C \cdot I_{source1})$$

$$T_{exp1} = N \cdot \tau_1$$

We claim:

1. A method for forming a pattern on a surface of a target by means of a beam of electrically charged particles in a number of exposure steps, each step comprising:
producing said particle beam;
directing said particle beam through a pattern definition means and producing a number of beamlets using an aperture array of the pattern definition means having a plurality of regularly arranged apertures of identical shape defining the shape and relative position of said beamlets, and using an electrically controllable blanking means of the pattern definition means to effectively switch off the passage of selected beamlets towards the target, the remaining beamlets forming, as a whole, a patterned particle beam;
projecting said patterned particle beam by means of an optical column comprising controllable particle optical means onto said substrate surface to form an image of those apertures which are switched on, each aperture corresponding to an image element on the substrate surface during respective uniformly timed exposure steps;
where there is a relative motion between the target and the pattern definition means according to the movement of the beamlets over a sequence of adjacent image elements on the substrate surface, resulting in an effective overall motion of the patterned particle beam over the target surface and exposing said image elements on the surface in each exposure step, wherein the image elements on the target are exposed to the beamlets multiply, namely several times during a number of exposure steps according to a specific sequence, wherein the sequence of exposure steps of the image elements is arranged on the time axis in a non-linear manner according to a specific rule in order to reduce the current variations in the optical column of the multi-beam exposure apparatus during the exposure of the pattern.

2. The method of claim 1, wherein the specific rule allows for a number of permutations all delivering the same dose to the target.

3. The method of claim 1, wherein the exposure patterns are modified by including additional exposures of selected image elements as dummy exposures in the sequence of exposure steps in order to reduce the overall current variations in the optical column during exposure, where dummy exposures are exposures of image elements on areas of the substrate that are not intended to be exposed and for which the modification does not change the effect of the exposure and where the total dose per image element remains below a certain threshold.

4. The method of claim 1, wherein the image elements on the target are exposed to a certain number C+1 of different grey levels, i.e., exposure levels interpolated between a minimal ('black') and maximal ('white') exposure dose, the respective grey level being realized by a sequence of exposure steps, in which the aperture of the respective image element is switched on or switched off, respectively, depending on the grey level, wherein the sequence of exposure steps being arranged non-linearly according to a specific rule.

5. The method of claim 4, wherein the specific rule for the switching sequence is given by a matrix G of N x (C+1) elements $g_{ij} \in \{0,1\}$, 0 denoting a "switched off"-state and 1 denoting a "switched on"-state, with N being the number of exposure steps, following the rule $$\sum_{i=1}^{N} g_{ij} = j \quad \forall\, j \in \{0, 1, \ldots C\},$$

j being the dose to be exposed.

6. The method of claim 5, wherein the matrix G further obeys the rule $$\left| \sum_{j=1}^{C} g_{ij} - \frac{C(C+1)}{2N} \right| \leq O_1 \text{ for all } i = 1, 2, \ldots, N.$$

7. The method of claim 6, wherein additionally for every image element of the image to be disposed on the substrate a proprietary matrix $G^{xy}$ of N x (C+1) elements $g_{ij}^{xy}$ is given, following the rule $$\left| N \cdot \sum_{(x,y)}^{S_{xy}} g_{ij}^{xy} - j \cdot \mathrm{card}(S_{xy}) \right| \leq O_2$$

$\forall\, j \in \{0, 1, \ldots, C\},\, i \in \{1, 2, \ldots, N\}$, $S_{xy} \subseteq \{(x, y)\, |\, 1 \leq x \leq X \text{ and } 1 \leq y \leq Y\},\, \mathrm{card}(S_{xy}) \geq n_{min}$.

8. The method of claim 4, wherein the switching sequence is adjusted in dependence of the pattern density D to be exposed in order to compensate for the target current variations caused by fluctuations of D, wherein the target current I(target) is determined using the equation I(target)=I(source)*AOR, with AOR being the "aperture opening ratio" according to the equation

AOR=D·C/N,

C being the number of different grey levels and N being the number of exposure steps.

9. The method of claim 1, wherein the non-patterned beam of electrically charged particles is interrupted in various exposure steps.

* * * * *